(12) United States Patent
Hadizadeh (10) Patent No.: US 10,679,946 B2
(45) Date of Patent: Jun. 9, 2020

(54) METHODS AND DEVICES FOR SOLDERLESS INTEGRATION OF MULTIPLE SEMICONDUCTOR DIES ON FLEXIBLE SUBSTRATES

(71) Applicant: wiSpry, Inc., Irvine, CA (US)

(72) Inventor: Rameen Hadizadeh, Tustin, CA (US)

(73) Assignee: WISPRY, INC., Irvine, CA (US)

( * ) Notice: Subject to any disclaimer, the term of this patent is extended or adjusted under 35 U.S.C. 154(b) by 0 days.

(21) Appl. No.: 16/380,483

(22) Filed: Apr. 10, 2019

(65) Prior Publication Data
US 2019/0311989 A1  Oct. 10, 2019

Related U.S. Application Data (60) Provisional application No. 62/655,545, filed on Apr. 10, 2018.

(51) Int. Cl.
| | | |
|---|---|---|
| *H01L 23/538* | (2006.01) | |
| *H01L 21/48* | (2006.01) | |
| *H01L 23/00* | (2006.01) | |

(52) U.S. Cl.
CPC ...... *H01L 23/5387* (2013.01); *H01L 21/4846* (2013.01); *H01L 24/08* (2013.01); *H01L 2224/02371* (2013.01)

(58) Field of Classification Search
None
See application file for complete search history.

(56) References Cited

U.S. PATENT DOCUMENTS

| | | | |
|---|---|---|---|
| 7,763,948 B2 * | 7/2010 | Leedy | G03F 7/70658 |
| | | | 257/419 |
| 2005/0082641 A1 | 4/2005 | Leedy | |
| 2009/0140442 A1 | 6/2009 | Lin | |
| 2015/0279778 A1 | 10/2015 | Camacho et al. | |

(Continued)

FOREIGN PATENT DOCUMENTS

WO    WO 2019/199966 A1    10/2019

OTHER PUBLICATIONS

International Search Report and Written Opinion for Application No. PCT/US2019/026782 dated Jul. 30, 2019.

*Primary Examiner* — Jack S Chen
(74) *Attorney, Agent, or Firm* — Jenkins, Wilson, Taylor & Hunt, P.A.

(57) ABSTRACT

Methods and devices for solderless integration of multiple semiconductor dies on flexible substrates. In some embodiments, a method for solderless integration of multiple semiconductor dies on flexible substrates includes arranging one or a plurality of semiconductor dies on a first carrier, active side down, and then depositing a sacrificial material over them. In some embodiments, the method further includes removing the first carrier and then building a wafer-level redistribution layer (RDL) over the active side of the one or plurality of semiconductor dies and the sacrificial material. In some embodiments, the method includes patterning the wafer-level RDL to form an outline of a final module footprint and then applying a second carrier to the wafer-level RDL. In some embodiments, the method can also include removing the sacrificial material from the one or plurality of semiconductor dies and the wafer-level RDL to achieve an integration of the one or plurality of semiconductor dies.

12 Claims, 9 Drawing Sheets

(56) References Cited

U.S. PATENT DOCUMENTS

2016/0329257 A1 11/2016 Scanlan et al.
2017/0033009 A1 2/2017 Scanlan et al.
2017/0133270 A1 5/2017 Strothmann et al.

* cited by examiner

METHODS AND DEVICES FOR SOLDERLESS INTEGRATION OF MULTIPLE SEMICONDUCTOR DIES ON FLEXIBLE SUBSTRATES

CROSS-REFERENCE TO RELATED APPLICATION

The present application claims priority to U.S. Provisional Patent Application Ser. No. 62/655,545, filed Apr. 10, 2018, the entire disclosure of which is incorporated by reference herein.

TECHNICAL FIELD

The subject matter disclosed herein relates generally to integrated circuits. More particularly, the subject matter disclosed herein relates to integration of circuit components on flexible substrates.

BACKGROUND

In today's electronics, integrated circuits are used in almost every household, consumer, and enterprise electronic device. One of the methods of creating an integrated circuit used in everyday electronics is heterogeneous integration. Heterogeneous integration refers to the integration of multiple separately manufactured circuit components into a single package in order to improve functionality and enhance operating characteristics. Heterogeneous integration allows for the packaging of components of different functionalities, different process technologies, and sometimes separate manufacturers. One of the downsides of current methods and processes for heterogeneous integration is the use of solder in those processes. As more and more electronics become flexible, or at least require flexible substrates for their integrated circuits, a new method of manufacturing heterogeneous integrated circuits is desired.

Solder is not very reliable in flexible applications such as those used in modern electronics like wearables and smart fabrics. Thus, in some applications, it is desirable to utilize a solderless method for integrating heterogenous silicon on one module. Additionally, substrates, modules, and processes for manufacturing heterogeneous integrated circuits need to be more reliable, have higher performance, and be more cost effective to meet the growing demands of these devices in modern consumer electronics.

In this context, there is also a need to design around traditional integrated circuit packaging technologies, as understood by those of ordinary skill in the art. Typically, traditional integrated circuit packaging technologies do not allow for a high degree of customization without the need for a rigid printed circuit board (PCB) or various substrates and lead-frames that generally accompany integrated circuit devices. By overcoming these flaws of traditional integrated circuit packaging technologies, the subject matter of the present disclosure can help minimize the need for rigid structures within the integrated circuit package and increase the flexibility of integrated circuit devices for use in flexible applications.

SUMMARY

In accordance with this disclosure, devices and methods for solderless integration of circuit components on flexible substrates are disclosed. The devices and methods disclosed herein attempt to provide integrated circuits that will meet some of the demands described above. In one aspect, a method for packaging one or more semiconductor dies is provided for use in flexible electronics, the method comprising: arranging one or more semiconductor dies, each comprising at least an active side, in a desired arrangement within a sacrificial material layer; building a wafer-level redistribution layer (RDL) over the active side of each of the one or more semiconductor dies and the sacrificial material layer, wherein the wafer-level RDL forms a directly metallized connection with the active side of each of the one or more semiconductor dies; patterning a portion of the wafer-level RDL to form an outline of a final module footprint; affixing a first carrier to the wafer-level RDL built over the active side of the one or more semiconductor dies and the sacrificial material layer; removing at least a portion of the sacrificial material layer from the one or more semiconductor dies and the wafer-level RDL to achieve an integration of the one or more semiconductor dies; and removing the first carrier from the active side of the one or more semiconductor dies or individually removing integrated semiconductor dies, along with their respective wafer-level RDLs, from the first carrier; wherein the wafer-level RDL comprises a flexible substrate material and serves as a flexible supporting substrate of the one or more semiconductor dies.

In accordance with another aspect of the present disclosure, an integrated circuit device is provided, the integrated circuit device comprising: one or more semiconductor dies, each comprising at least an active side; and a wafer-level redistribution layer (RDL) that forms a directly metallized connection with the active side of each of the one or more semiconductor dies and comprises a flexible substrate material that supports the one or more semiconductor dies together while allowing substantial movement of the wafer-level RDL with respect to the one or more semiconductor dies.

In accordance with yet another aspect of the present disclosure, an integrated circuit module is provided for use in flexible electronics manufactured by a process comprising: arranging one or more semiconductor dies, each comprising at least an active side, in a desired arrangement within a sacrificial material layer; building a wafer-level redistribution layer (RDL) over the active side of each of the one or more semiconductor dies and the sacrificial material layer, wherein the wafer-level RDL forms a directly metallized connection with the active side of each of the one or more semiconductor dies; patterning a portion of the wafer-level RDL to form an outline of a final module footprint; affixing a first carrier to the wafer-level RDL built over the active side of the one or more semiconductor dies and the sacrificial material layer; removing at least a portion or all of the sacrificial material layer from the one or more semiconductor dies and the wafer-level RDL to achieve an integration of the one or more semiconductor dies; and removing the first carrier from the active side of the one or more semiconductor dies or individually removing integrated semiconductor dies, along with their respective wafer-level RDL, from the first carrier; wherein the wafer-level RDL comprises a flexible substrate material that serves as a flexible supporting substrate of the one or more semiconductor dies; and wherein the one or more semiconductor dies is significantly less flexible than the wafer-level RDL.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

Example features and advantages of the present subject matter will be more readily understood from the following detailed description which should be read in conjunction with the accompanying drawings that are given merely by way of explanatory and non-limiting example, and in which.

DETAILED DESCRIPTION

The present subject matter provides devices and methods for solderless integration of circuit components on flexible substrates. In some aspects the methods and devices provided herein describe packaging two or more semi-conductor dies for use in flexible electronics. In some aspects, the subject matter disclosed herein can comprise various circuit components including plasma-diced rectangular or non-rectangular dies and flexible polymers, such as polyimide, as substrates. The subject matter disclosed herein provides circuit modules that are flexible and comprised of a better coefficient of thermal expansion (CTE) matching structure, giving the module a higher reliability over conventional devices. In some embodiments, the phrase "a better CTE matching structure," means that the methods and devices of the present disclosure have better CTE matching properties when compared to traditional semiconductor dies with fiberglass printed circuit board and solder interconnects. CTE mismatch becomes an issue when considering cyclic thermal stresses such as temperature cycling. The mismatch is still relevant for constant high or constant low temperature stressing, however, since with cyclic stressing (i.e., hot to cold and vice versa, repeatedly), the material interfaces (since the adjacent materials expand and contract at differing rates, given by the CTE coefficient) experience repeated expansion and/or contraction, which ultimately leads to fatigue.

In some embodiments, the materials of each element of the present circuit components can be selected to have similar CTE coefficients, thereby reducing the amount of relative expansion and/or contraction the interfaces undergo during cyclic thermal stresses, thus the stress conditions are less severe, and the assembly may never reach fatigue. Traditional semiconductor dies have a CTE of about 2.5 ppm/° C., typical fiberglass PCBs have a CTE of between about 15 and 20 ppm/° C., and typical solder interconnects have a CTE of about 30 ppm/° C. The CTE of a typical polyimide is around 35 ppm/C, for example, which is nowhere close to the CTE of silicon.

Alternatively or in addition to controlling for CTE mismatch between interconnect and device, the circuit components described herein can further be integrated together using flexible substrates so that the dies are not constrained by a rigid PCB, and therefore the expansion and/or contraction caused by thermal cycling is translated into motion experienced by the entire system instead of by the individual dies. A flexible interconnect between neighboring dies can bend and flex in response to cyclic thermal expansion and/or contraction whereas a rigid PCB cannot, thus transferring the cyclic thermal stress to the solder interconnects that bind the package to the PCB. In this sense, making the interconnect "more compliant" than that of a rigid PCB can further improve reliability. PCB interconnects are compliant to an extent, but are rigid in comparison to the ability of a flexible polymer/metal interconnect to bend freely when stressed.

Regardless of the particular configuration, it is the overall compliance of the system that allows the material interfaces to survive much longer than traditionally possible, potentially indefinitely. The flexible heterogeneous integration, as described in the present disclosure obviates the need for typical fiberglass PCBs and the solder interconnects, replacing them with a flexible polymer-copper-polymer wafer-level redistribution layer or structure. Additionally, the subject matter disclosed provides circuit modules with minimal signal interconnect length giving the module a higher performance over conventional modules. Specifically, the subject matter disclosed herein involves no solder interconnects, thus bridging the gap between the foundry and end-application feature size. In that regard, unreliable interfaces (solder joints) are removed and replaced with interconnects that have much more mechanical compliance under cyclic fatigue (e.g., temperature cycling). Additionally, rigid PCBs and packaging are obviated and the integrated circuit devices are connected directly with copper and polymer structures (i.e., the wafer-level RDL).

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art and should not be interpreted in an idealized or overly formal sense unless expressly so defined herein.

Aspects of the subject matter are described herein with reference to side or top view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects or embodiments set forth herein. In the drawings, the size and relative sizes of layers and regions can be exaggerated for clarity.

Unless the absence of one or more elements is specifically recited, the terms "comprising", "including", and "having" as used herein should be interpreted as open-ended terms that do not preclude the presence of one or more elements. Like numbers refer to like elements throughout this description.

In one aspect, the present subject matter provides a method for packaging two or more semiconductor dies for use in flexible electronics. This method is a multi-die integration process. FIGS. 1A-1H illustrate side views of circuit components and various other parts of the integrated circuit device 100 as the integration process is followed. As the process is followed, the integrated circuit device 100 is transformed from a collection of semiconductor dies 102 to an integrated circuit device 100 with a flexible substrate, generally identified below as a wafer-level RDL 110. In FIGS. 1A-1H, it is important to note that the two dies 102 are not intended for individual packaging. The packaging method disclosed herein is for the integration of two or more dies, however, they do not necessarily need to be dissimilar. In some embodiments of the present disclosure, the semiconductor dies 102 will be dissimilar, and thus the process can be referred to as "heterogeneous integration". In other embodiments of the present disclosure the two or more dies 102 are similar, and thus the process can be simply referred to as "integration".

Figure 1A:
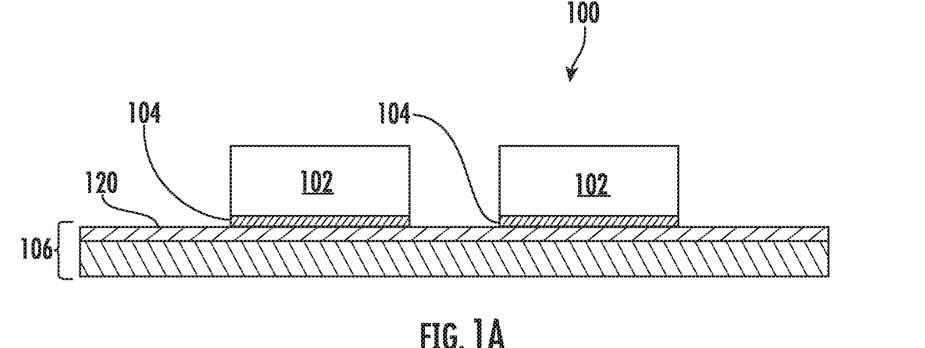
FIG. 1A illustrates a side view of an integrated circuit device after the first step in the process for solderless integration of circuit components on flexible substrates, according to the disclosure herein.

In FIG. 1A, the process of creating the integrated circuit device 100 can include arranging one or a plurality of semiconductor dies 102 in a desired arrangement on a first carrier 106. In some embodiments, the first carrier 106 can be an adhesive carrier, and arranging the plurality of semiconductor dies 102 on the first carrier 106 comprises adhering the plurality of semiconductor dies 102 to the first carrier 106. In some embodiments, arranging the plurality of semiconductor dies 102 on the first carrier 106 comprises affixing the plurality of semiconductor dies 102 to the first carrier 106. In some embodiments, there are various other ways in which the plurality of semiconductor dies 102 can be attached, affixed, adhered, joined, or otherwise secured to the first carrier 106 including any other method known to those of ordinary skill in the art. As shown in FIG. 1A, the first carrier 106 comprises a top layer 120. In some embodiments, the top layer 120 comprises a low-residual removable tape or a UV sensitive epoxy. The semiconductor dies 102 are made from semiconductor material comprising at least an active side 104. In some embodiments, the semiconductor dies 102 are arranged on the first carrier 106 with their active sides 104 facing down on the top layer 120 of the first carrier 106.

Figure 1B:
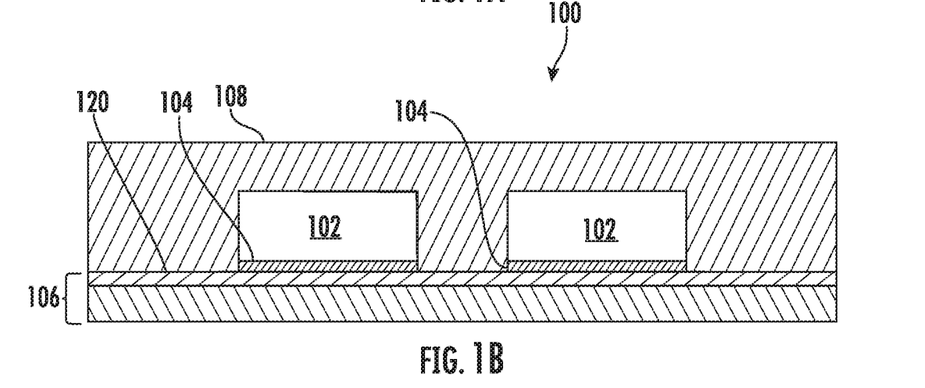
FIG. 1B illustrates a side view of the integrated circuit device after the second step in the process for solderless integration of circuit components on flexible substrates, according to the disclosure herein.

As shown in FIG. 1B, once the semiconductor dies 102 are arranged on the top layer 120 of the first carrier 106, a sacrificial (SAC) material 108 can be deposited over the semiconductor dies 102 and the first carrier 106. In some embodiments, the plurality of semiconductor dies 102 are arranged in a desired arrangement within the SAC material 108. In some embodiments, the SAC material 108 can be selected to be any of a variety of materials that can maintain the semiconductor dies 102 in the desired arrangement but can be selectively removed once the semiconductor dies 102 are otherwise secured in their relative positions. In some embodiments, the SAC material 108 has either wet or dry etch selectivity with regard to the redistribution layer (RDL) polymer to be used (described below) and the non-active faces of the semiconductor dies 102. In some embodiments, the desired arrangement in which the semiconductor dies 102 are placed can be based on the need to maintain flexibility of the resulting integrated circuit module, performance, or other considerations.

Figure 1C:
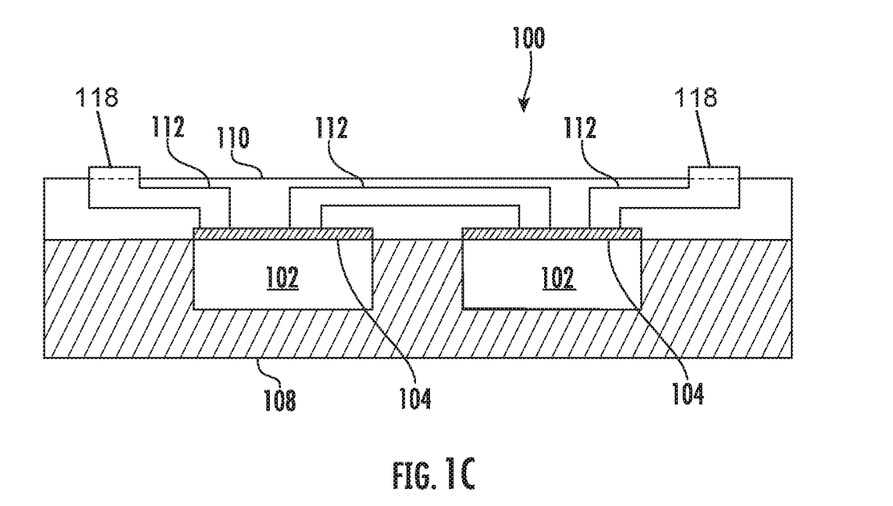
FIG. 1C illustrates a side view of the integrated circuit device after the third step in the process for solderless integration of circuit components on flexible substrates, according to the disclosure herein.

In FIG. 1C, the view of the integrated circuit device 100 is rotated 180 degrees from FIG. 1A and FIG. 1B. This is so because in some embodiments, wafer-level lithographing processes are typically performed in equipment where the active side 104 of the semiconductor dies 102 are faced up. However, those of ordinary skill in the art will appreciate that the process is not so limited to any particular orientation or position. As shown in FIG. 1C, after the SAC material 108 has been deposited over the semiconductor dies 102, in some embodiments, the first carrier 106, including the top layer 120, is removed. In some embodiments, following the removal of the first carrier 106, a wafer-level RDL 110 is built over the active side 104 of the semiconductor dies 102 and the SAC material 108. The wafer-level RDL 110 may be formed or otherwise provided as a single-level or multi-level redistribution layer. In some embodiments of the present disclosure, the wafer-level RDL 110 comprises a flexible substrate material. In some embodiments of the present disclosure, the wafer-level RDL 110 is in direct electrical communication with the active side 104 of each of the plurality of semiconductor dies 102 (i.e., in direct electrical communication with electrical contacts with each of the plurality of semiconductor dies 102). By direct electrical communication, it is meant that there is an electrical interconnect from semiconductor die to semiconductor die and from semiconductor die to pad that is directly metallized without solder and without the use of a pre-fabricated interposer. In other words, in some embodiments, the wafer-level RDL 110 forms a directly metallized connection (without solder and without with use of a pre-fabricated interposer) with the active side 104 of each of the plurality of semiconductor dies 102. In some embodiments, such a directly metallized connection is formed by, for example and without limitation, plating or otherwise depositing thin film conductor layers on the active side 104 of each of the plurality of semiconductor dies 102. In some embodiments of the present disclosure, the thin film conductor layers are made from conductive materials that have a higher melting point than most types of solder. For example and without limitation, the thin film conductor layers could be comprised of copper, aluminum, nickel, gold, titanium, vanadium, silver, chromium, or other suitable conductive material. In some embodiments of the present disclosure, only dielectrics and the wafer-level RDL 110 connect the active side 104 of each of the plurality of semiconductor dies 102.

In some embodiments, the wafer-level RDL 110 serves as a flexible supporting substrate of the plurality of semiconductor dies 102. In some embodiments, the plurality of semiconductor dies 102 is substantially less flexible than the wafer-level RDL 110. In some embodiments, the wafer-level RDL 110 comprises a flexible substrate material that supports the plurality of semiconductor dies 102 together while allowing relative movement among the plurality of semiconductor dies 102. The flexible substrate material, in some embodiments, has flexible die-to-die interconnects with material properties, such as, for example, elastic modulus or physical thickness (described further hereinbelow), that reduces stress caused by cyclic thermal expansion and contraction. In further embodiments of the present disclosure, the wafer-level RDL 110 is comprised of polyimide flex.

In some embodiments of the present disclosure, the wafer-level RDL 110 comprises one or more layers of copper. In some embodiments, the wafer-level RDL 110 comprises one or more layers of aluminum, nickel, gold, titanium, vanadium, silver, chromium, or other suitable material. In some embodiments, the wafer-level RDL 110 comprises one or more polymer layers. In some embodiments, the wafer-level RDL 110 comprises one or more of the metals described above and one or more layers of polymer. In some embodiments, a metal layer, such as a copper layer of the wafer-level RDL 110 can be between about 1 µm and 20 µm thick. In some embodiments, a thickness of a polymer layer of the wafer-level RDL 110 is typically similar to or thicker than the metal, or copper layer of the wafer-level RDL 110. For example and without limitation, in some embodiments, a thickness of the polymer layer of the wafer-level RDL 110 can be between about 1 µm and 30 µm. In some embodiments, with a single level of wafer-level RDL 110, a total thickness of the interconnect can be between about 10 µm and 20 µm. In some embodiments, for a multi-level wafer-level RDL 110 interconnect, the thickness could approach between about 50 µm and 100 µm. In some embodiments, the interconnect thickness could surpass the thickness of the individual dies or devices.

In some embodiments, the device substrate itself (silicon, quartz, sapphire, etc.) can be as thin as the backgrind equipment and device performance will allow. In some embodiments, this could be anywhere from full wafer thickness of about 800 µm down to about 10 µm. In some embodiments, the substrate can be fully removed after flexible interconnect assembly with only the necessary active layers remaining (doped/diffused source and drain silicon regions and subsequent CMOS interconnects, for example).

In the context of the above description, "flexible or flexibility" means that a module created by the process of the present disclosure can be bent, or otherwise distorted, to its most extreme range of motion without the module fracturing or tearing. As incorporated into the present integrated circuit device 100, such flexibility can allow the semiconductor dies 102 to be moved to different positions, angles, or orientations relative to one another without compromising the integrity of the electrical interconnection provided by the wafer-level RDL 110. For example and without limitation, for two modules as described herein, connected by a flexible interconnect, one could conceivably bend the module such that the backs of the semiconductor dies 102 are touching, or the same flexion amount in the opposite direction, and still maintain electrical and structural integrity of the flexible interconnect. More specifically, in some embodiments, "flexible" can be defined as the ability to flex to the full range of elastic motion (i.e., bending the module such that the backs of the semiconductor dies 102 are touching or a flexion of the same amount in the opposite direction) without any evidence of inelastic or plastic deformation. In other words, the flexible interconnect can flex in the manner described above and then return to its original shape and form without physically observable deformation.

In some embodiments, the flexibility of the integrated circuit device 100 can depend on many factors, including the dimensions of the wafer-level RDL 110, the semiconductor dies 102, and various other components. The flexibility of the integrated circuit device 100 can also depend on the particular application. For example and without limitation, in some embodiments, the integrated circuit device 100 can be used on a corner of a mobile device and folded along the corner of the device. In other embodiments, the integrated circuit device 100 can be folded or wrapped around a curved surface, wherein the curved surface can be slightly or even substantially curved. However, those possessing ordinary skill in the art will appreciate that the flexibility of the integrated circuit device 100 can vary based on the dimensions and geometries, including die thickness, of the various components integrated into the integrated circuit device 100. Additionally, it should be noted that the module flexing could include the attachment points 118 being flexed to a different plane than the semiconductor dies 102. The attachment points 118 can be soldered to a PCB or otherwise make an electrical connection to other circuit elements other than the semiconductor dies 102 or wafer-level RDL 110. In some embodiments, the attachment points 118 are laterally spaced from the semiconductor dies 102 and thus, are capable of flexing separately from the semiconductor dies 102. In this context, for the purposes of manufacturability and to leverage existing wafer-level "fan-out" technology, any photo-definable polymer could be used as a dielectric layer and any conductive metal, such as for example and without limitation, aluminum, nickel, gold, titanium, vanadium, silver, chromium, or other suitable material, could be used as the RDL for signals and connections.

Furthermore, as shown in FIG. 1C, in some embodiments, the wafer-level RDL 110 comprises contacts 112 that are each in electronic communication with the active side 104 of at least one of the semiconductor dies 102. In some embodiments, the contacts 112 are not soldered to the active sides 104 of the semiconductor dies 102 but are otherwise connected directly or indirectly to them by the process of building the wafer-level RDL 110. In this context, redistribution metals and/or dielectrics are utilized without solder as the structural and electrical connection between the semiconductor dies 102 and the contacts 112. In some embodiments, the contacts 112 are not just in electronic communication with the active sides 104 of the semiconductor dies 102, but also disposed within the wafer-level RDL 110. Additionally, during the process of building the wafer-level RDL 110, in some embodiments, at least a portion of some of the contacts 112 are exposed outside of the wafer-level RDL 110 on an opposite side of the wafer-level RDL 110 as the plurality of semiconductor dies 102. This allows for further applications of components beyond the semiconductor dies 102. Using this method, there is reduced parasitic loss between the semiconductor dies 102 and whatever they are connecting to, whether that be other semiconductor dies 102 or other device attached to the contacts 112. Furthermore, this method of fabricating the integrated circuit device 100 is less expensive than traditional methods using solder and/or other ubiquitous packaging materials such as leadframes, substrate interposers, and overmolding.

In accordance with further embodiments of the present disclosure, redistribution metals and dielectrics are utilized without solder as the structural and electrical connection between the semiconductor dies 102 and contacts 112. Additionally, neither die-to-die connections nor the final structure requires solder interconnects. In some embodiments, adjacent semiconductor dies 102 are able to flex out of an x, y, and/or z-plane at 180 degrees in either direction. Depending on the necessities of the applications for which the modules are being used, flexible interconnects can conform to fit varying curvatures, including bending back onto themselves, in some embodiments. As described herein, in some embodiments, the semiconductor dies 102 can embody any shape, for example, circular, rectangular, hexagonal, or polygonal. Moreover, in some embodiments, die-to-die interconnects can be comprised of one or more wafer-level RDLs 110.

In some embodiments of the present disclosure, the contacts 112 are made from metal, typically copper. However, in further embodiments of the present disclosure, the contacts 112 can be made from aluminum, nickel, gold, titanium, vanadium, silver, chromium, or other suitable material. Those of ordinary skill in the art will appreciate still other options for the material composition of the contact 112, including other metals contained within the definition of transition or post-transition metals on the Periodic Table of Elements. In some embodiments, the exposure of the contacts 112 is completed by patterning openings in the wafer-level RDL 110. For example, in some embodiments, the wafer-level RDL 110 can comprise a photo-sensitive polymer that passivates the wafer-level RDL 110, and the openings can be patterned by photo imaging. In some embodiments, apart from the patterned openings, all other RDL is passivated.

Those of ordinary skill in the art will appreciate that in further embodiments of the present disclosure, wafer-level RDLs 110 may incorporate circuit components, including, for example, embedded passives or inductor coils in redistribution metal. Additionally, in some embodiments, die-to-die interconnects can be passivated with one or any combination of dielectric material, including, for example, one or more polymers, epoxies, or other suitable material. In some embodiments of the present disclosure, all sides of the semiconductor dies 102 are exposed with the exception of the active side 104, as disclosed hereinabove.

Figure 1D:
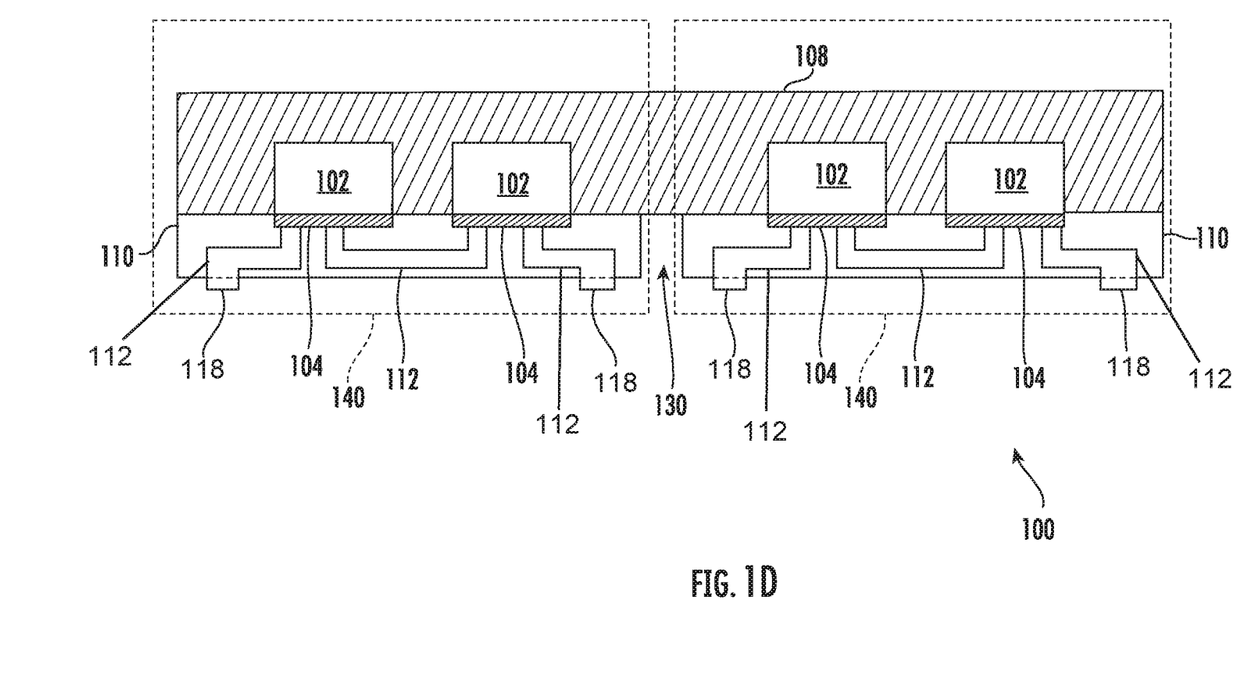
FIG. 1D illustrates a side view of the integrated circuit device after the fourth step in the process for solderless integration of circuit components on flexible substrates, according to the disclosure herein.

In FIG. 1D, the view of the integrated circuit device 100 is rotated 90 degrees from FIG. 1C to fit the entire figure. FIG. 1D depicts two modules 140 connected together via a common layer or layers of the SAC material 108. Although FIG. 1D shows this process can include just two modules 140, those of ordinary skill in the art will appreciate that the process may comprise many modules 140 all connected by the same layer or layers of the SAC material 108. In FIGS. 1A-1H, a module 140 is shown as including two semiconductor dies 102 along with their respective attachments and layers. In order to maintain clear reference labels in this figure, only one module 140 is indicated by a dotted border. However, as can be seen in the figured, a second set of two semiconductor dies 102 is shown adjacent to the module 140 and could be an additional module 140. Additionally, the wafer-level RDL 110 can, in some embodiments, be built across all the modules 140. In some embodiments of the present disclosure, at least a portion of the wafer-level RDL 110 polymer can be photo-imaged, patterned, or otherwise divided to form the outline of final module 140. In some embodiments, the wafer-level RDL 110 can be comprised of photo-imagable materials or non-photo-imagable materials that can be patterned using wet or dry etching. As illustrated in FIG. 1D, a gap 130 depicts the space created by such a division of the wafer-level RDL 110. This gap 130 will aid in subsequent singulation of the modules 140. In some embodiments, as depicted in FIG. 1D, at least a portion of the contacts 112 can be exposed on an opposite side of the wafer-level RDL 110 from the active side 104 of the semiconductor dies 102.

Figure 1E:
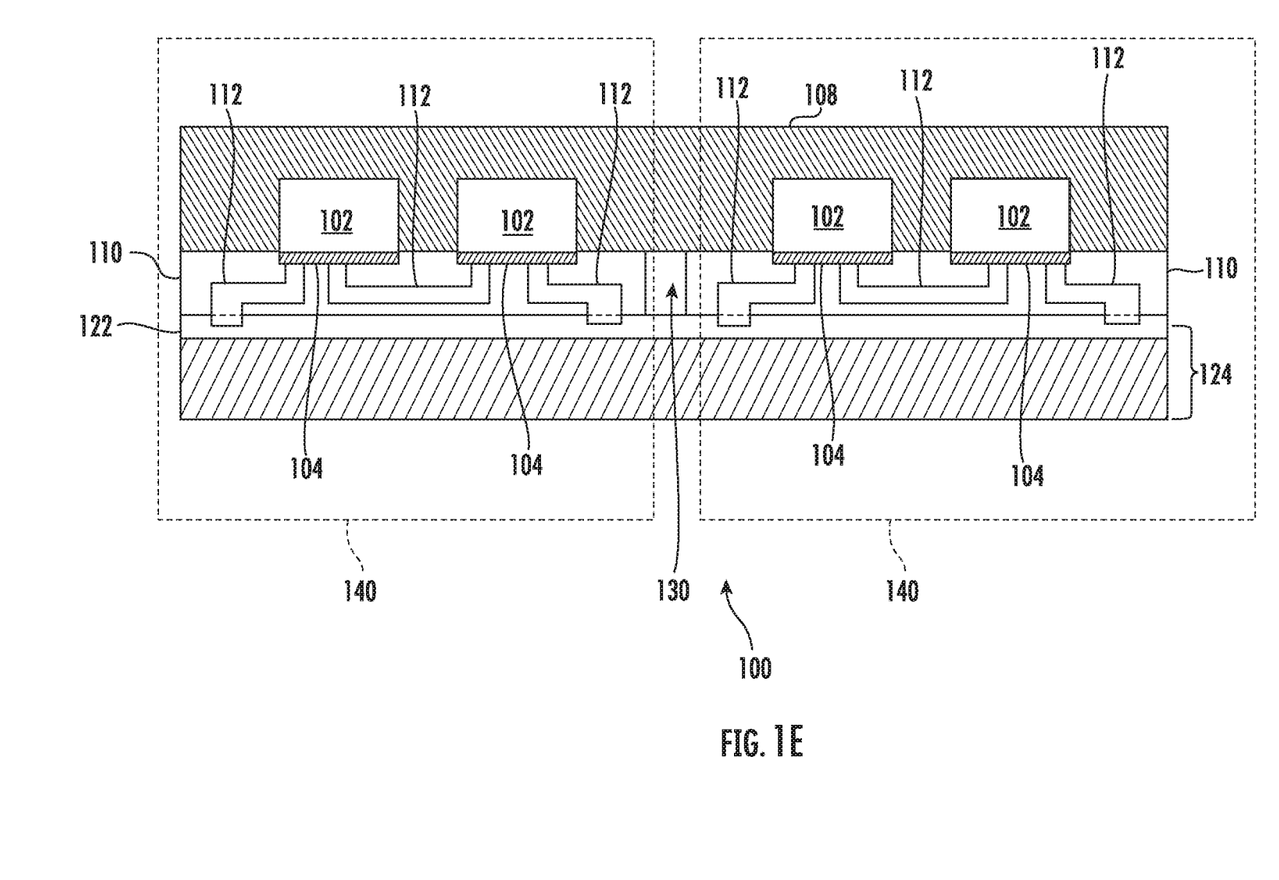
FIG. 1E illustrates a side view of the integrated circuit device after the fifth step in the process for solderless integration of circuit components on flexible substrates, according to the disclosure herein.

In FIG. 1E, a second carrier 124 with top layer 122 is applied to the wafer-level RDL 110 of the integrated circuit device 100. The second carrier 124, in some embodiments, can comprise the same or similar material as the first carrier 106 described hereinabove. Furthermore, in some embodiments, the second carrier 124 can be an adhesive carrier, and applying the wafer-level RDL 110 to the integrated circuit device 100 comprises adhering or affixing the second carrier 124 to the wafer-level RDL 110. In some embodiments, there are various other ways in which the second carrier 124 can be attached, affixed, adhered, joined, or otherwise secured to the wafer-level RDL 110 including any other method known to those of ordinary skill in the art. As illustrated by FIG. 1E, in some embodiments, the top layer 122 can cover or overlay on top of any portions of the contacts 112 that were exposed when the wafer-level RDL 110 was formed.

Figure 1F:
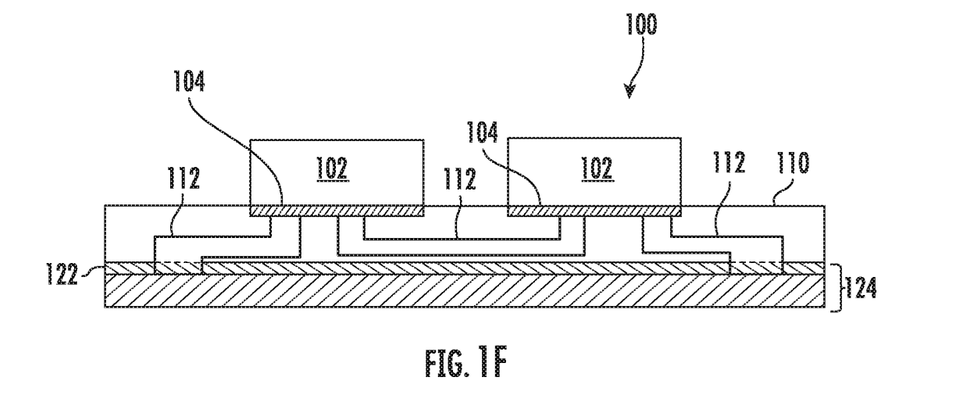
FIG. 1F illustrates a side view of the integrated circuit device after the sixth step in the process for solderless integration of circuit components on flexible substrates, according to the disclosure herein.

In FIG. 1F, the view of the integrated circuit device 100 is rotated 90 degrees clockwise from FIG. 1E. As shown in FIG. 1F, in some embodiments of the next stage of the process, at least a portion of the SAC material 108 is removed from the semiconductor dies 102 and the wafer-level RDL 110 to achieve an integration of the plurality of semiconductor dies 102. Those of ordinary skill in the art will appreciate that in some embodiments, the SAC material 108 can be removed using either wet or dry etching or any other suitable method. In some embodiments, during this step in the process, bulk silicon can be etched away from the integrated circuit device 100 to achieve a "die-less" integrated circuit module.

Figure 1G:
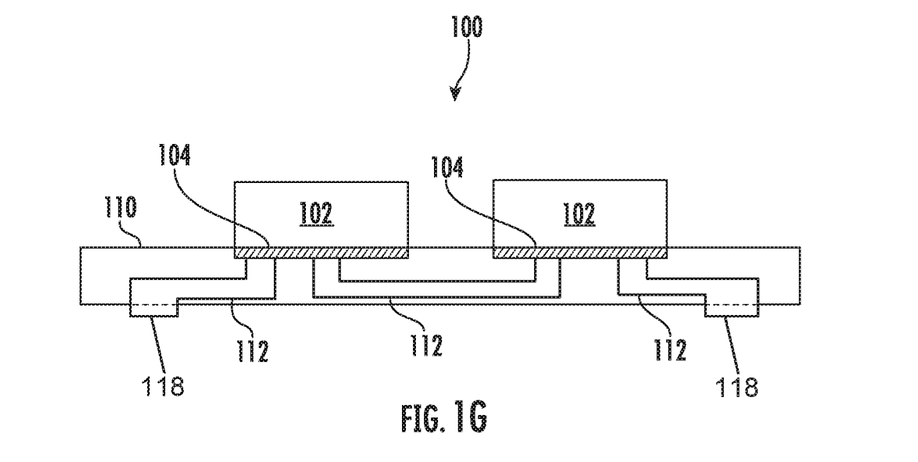
FIG. 1G illustrates a side view of the integrated circuit device after the seventh step in the process for solderless integration of circuit components on flexible substrates, according to the disclosure herein.

As shown in FIG. 1G, the SAC material 108 has been removed. Furthermore, in some embodiments of this step of the process, either the second carrier 124 with top layer 122 is removed from all of the modules 140 prepared in the process, or just the one integrated circuit device 100 (or module 140 as shown in FIG. 1H) is removed from the second carrier 124 and top layer 122.

Figure 1H:
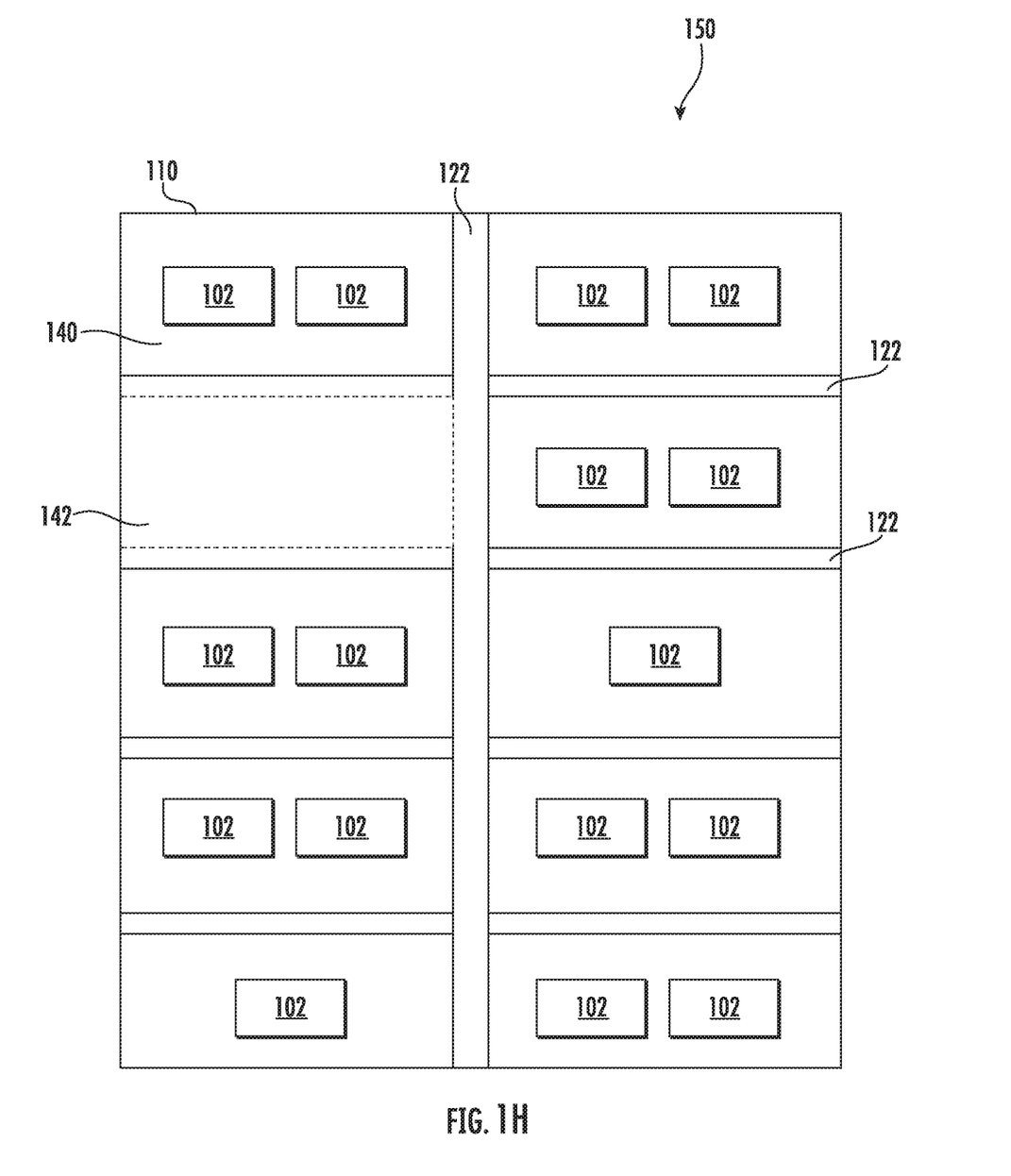
FIG. 1H illustrates a top view showing a manufacturing sheet comprising a plurality of semiconductor dies arranged and affixed to the wafer-level RDL, according to the disclosure herein.

FIG. 1H illustrates a top view showing a manufacturing sheet generally designated 150, comprising a plurality of semiconductor dies 102 arranged and affixed to the wafer-level RDL 110. As shown in FIG. 1H, in some embodiments, a single semiconductor die 102 can be singulated, or diced, or a plurality of semiconductor dies 102 can be singulated, or diced, such that they create a module 140. FIG. 1H depicts both two semiconductor dies 102 as a single module and one semiconductor die 102 as a module. However, this depiction is for illustrative purposes only. Those of ordinary skill in the art will appreciate that a module 140 may comprise one or a plurality of semiconductor dies 102. As described in FIG. 1G, during the process where "just one integrated circuit device 100 (or module 140 . . . ) is removed from the second carrier 124 and top layer 122," those of ordinary skill in the art will understand this to mean that one of the modules 140 in FIG. 1H can be diced and removed from the second carrier 124 and top layer 122, as depicted by the empty module space 142. The empty module space 142 illustrates that a single module 140 has been removed from the manufacturing sheet 150. Alternatively, the second carrier 124 and top layer 122 may be removed from the entire sheet, instead of removing modules 140 individually.

Also, the gap 130 formed by the selective removal of portions of the wafer-level RDL 110 (not designated in this view) allows the layer 122 of the second carrier 124 to be seen in this top view. In this view, those of ordinary skill in the art will appreciate that a module 140 can comprise, in some embodiments, one or two semiconductor dies 102. However, as described above, in some embodiments, a module 140 can comprise more than two semiconductor dies 102. FIG. 1H depicts a top view of ten of the integrated circuit devices 100 described in the section regarding FIG. 1F. In this context, ten of the integrated circuit devices 100 from FIG. 1F are arranged on a manufacturing sheet 150, which comprises the second carrier 124 and top layer 122. Once the integrated circuit device is ready for delivery, they could either be shipped on the second carrier 124 or be placed in a tray.

In some embodiments, singulation or dicing of the semiconductor die modules 140 is not required. In further embodiments, semiconductor die 102 thickness can vary, depending on the properties of the semiconductor die 102 or its applications and intended use. Finally, as those of ordinary skill in the art will appreciate, in some embodiments, metallized lands can be integrated into the process disclosed hereinabove to accommodate subsequent surface-mount technology (SMT) of additional components, for example, passives, packages, or similar components.

Figure 1I:
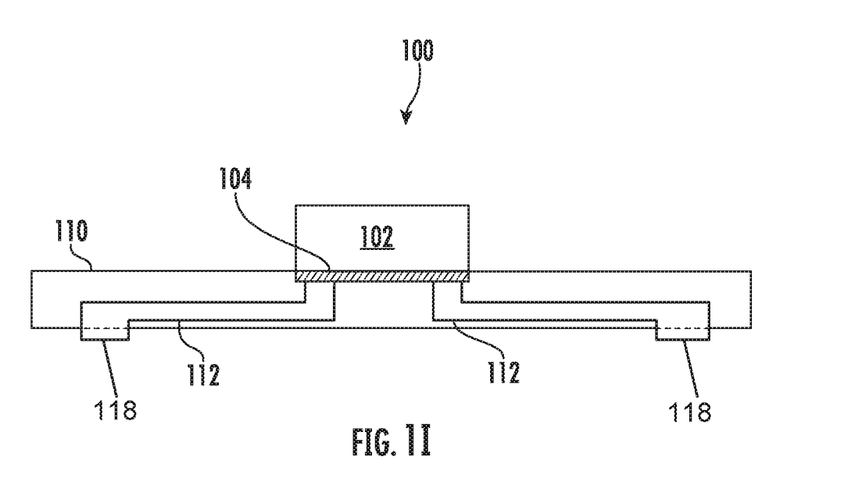
FIG. 1I illustrates a side view of the integrated circuit device after the seventh step in the process for solderless integration of circuit components on flexible substrates, except in this illustration, there is only one singulated die.

FIG. 1I illustrates a side view of an example integrated circuit device 100 manufactured using the process described above, however, in this case, the integrated circuit device 100 comprises only one semiconductor die 102. In such an embodiment, with one semiconductor die 102, the module is flexible for wearable applications, like those modules with a plurality of semiconductor dies 102. Also, in the context of a single semiconductor die 102, "flexible or flexibility" means that a module created by the process of the present disclosure can be bent, or otherwise distorted, to its most extreme range of motion without the module fracturing or tearing. In some embodiments, "flexible or flexibility" can also mean allowing substantial movement of the wafer-level RDL 110 in any direction with respect to the one semiconductor die 102 without any physically observable deformation in the integrated circuit device 100. For example and without limitation, for one semiconductor die 102 as described herein, with flexible interconnects extending from the active side 104 of the semiconductor die 102, one could conceivably bend the module in any various directions and magnitudes (i.e., bend completely such that opposite sides of the module are touching each other, bend only slightly, or being in the opposite direction that that described above) and still maintain electrical and structural integrity of the flexible interconnect.

More specifically, in some embodiments, "flexible" can be defined as the ability to flex to the full range of elastic motion (i.e., bending the module such that opposite ends of the module are touching each other, or could touch each other if the wafer-level RDL 110 was long enough, or a flexion of the same amount in the opposite direction) without any evidence of inelastic or plastic deformation. In other words, the flexible interconnect can flex in the manner described above and then return to its original shape and form without physically observable deformation. In some embodiments, the flexibility of the integrated circuit device 100 can depend on many factors, including the dimensions of the wafer-level RDL 110, the semiconductor die 102, and various other components. The flexibility of the integrated circuit device 100 can also depend on the particular application. For example and without limitation, in some embodiments, the integrated circuit device 100 can be used on a corner of a mobile device and folded along the corner of the device. In other embodiments, the integrated circuit device 100 can be folded or wrapped around a curved surface, wherein the curved surface can be slightly or even substantially curved. However, those possessing ordinary skill in the art will appreciate that the flexibility of the integrated circuit device 102 can vary based on the dimensions and geometries, including die thickness, of the various components integrated into the integrated circuit device 100. Additionally, it should be noted that the module flexing could include the attachment points 118 being flexed to a different plane than the single semiconductor die 102. In some embodiments, the attachment points 118 are laterally spaced from the semiconductor die 102 and thus, are capable of flexing separately from the semiconductor die 102.

Figure 2:
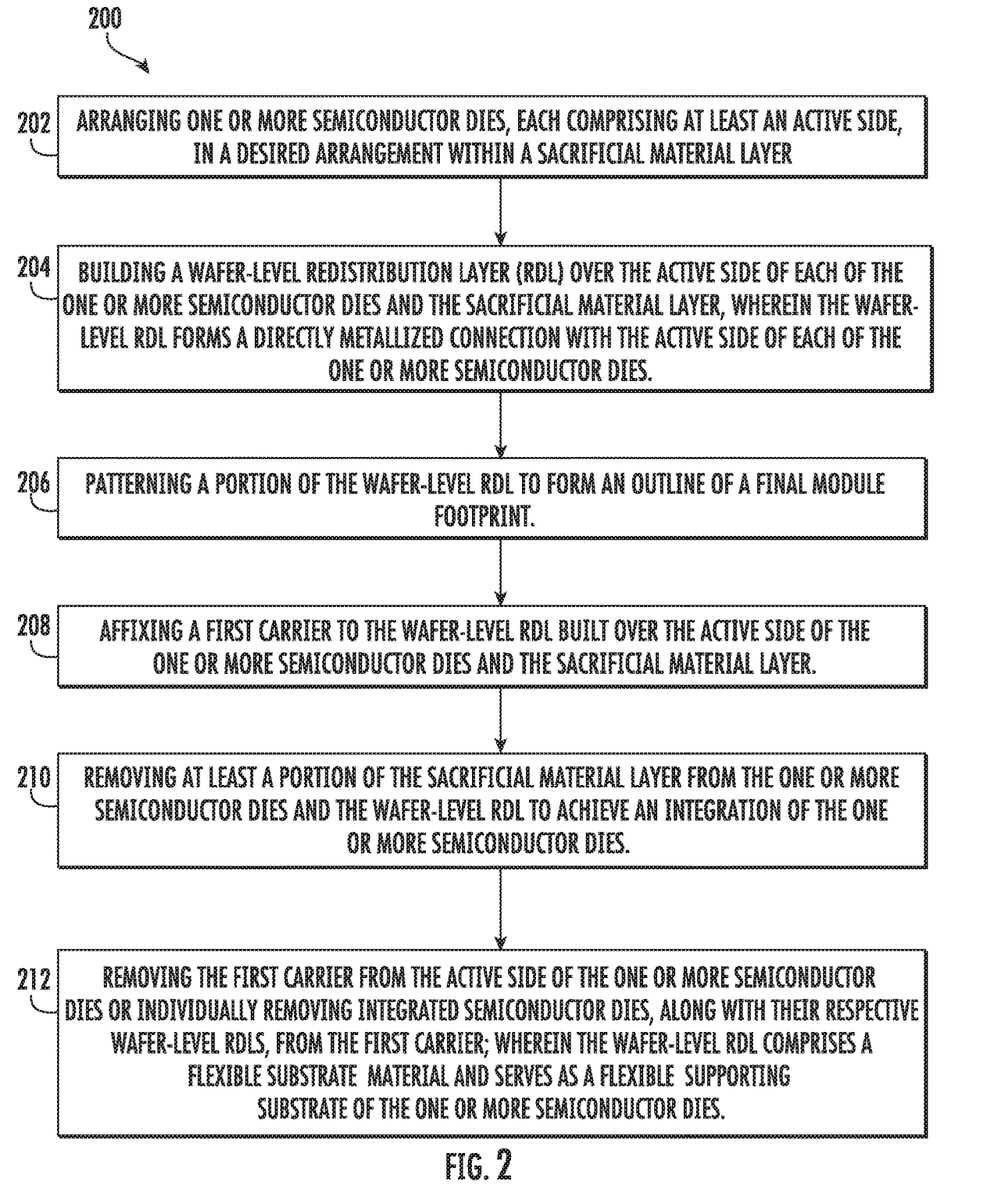
FIG. 2 illustrates a flow chart detailing some of the steps in the method for solderless integration of circuit components on flexible substrates, according to the disclosure herein.

Moving next to FIG. 2, flow chart 200 illustrates some of the method steps for packaging two or more semiconductor dies for use in flexible electronics as described hereinabove. In accordance with some embodiments of the present disclosure and as shown in step 202, the method steps comprise arranging one or more semiconductor dies, each comprising at least an active side, in a desired arrangement within a sacrificial material layer. Next, as shown in step 204, the method comprises building a wafer-level redistribution layer (RDL) over the active side of each of the one or more semiconductor dies and the sacrificial material layer, wherein the wafer-level RDL forms a directly metallized connection with the active side of each of the one or more semiconductor dies. Next, as shown in step 206, the method comprises patterning a portion of the wafer-level RDL to form an outline of a final module footprint.

As shown in step 208, the method further comprises affixing a first carrier to the wafer-level RDL built over the active side of the one or more semiconductor dies and the sacrificial material layer. Next, as shown in step 210, the method comprises removing at least a portion of the sacrificial material layer from the one or more semiconductor dies and the wafer-level RDL to achieve an integration of the one or more semiconductor dies. Finally, as shown in step 212, the method comprises removing the first carrier from the active side of the one or more semiconductor dies or individually removing integrated semiconductor dies, along with their respective wafer-level RDLs, from the first carrier; wherein the wafer-level RDL comprises a flexible substrate material and serves as a flexible supporting substrate of the one or more semiconductor dies.

Additionally, the method for packaging two or more semiconductor dies for use in flexible electronics can optionally comprise exposing the one or more contacts on an opposite side of the wafer-level RDL as the plurality of semiconductor dies. Furthermore, the method can optionally comprise providing redistribution metals or dielectrics, or redistribution metals and dielectrics, without solder as a structural and electrical connection between the plurality of semiconductor dies and the one or more contacts.

Figure 3:
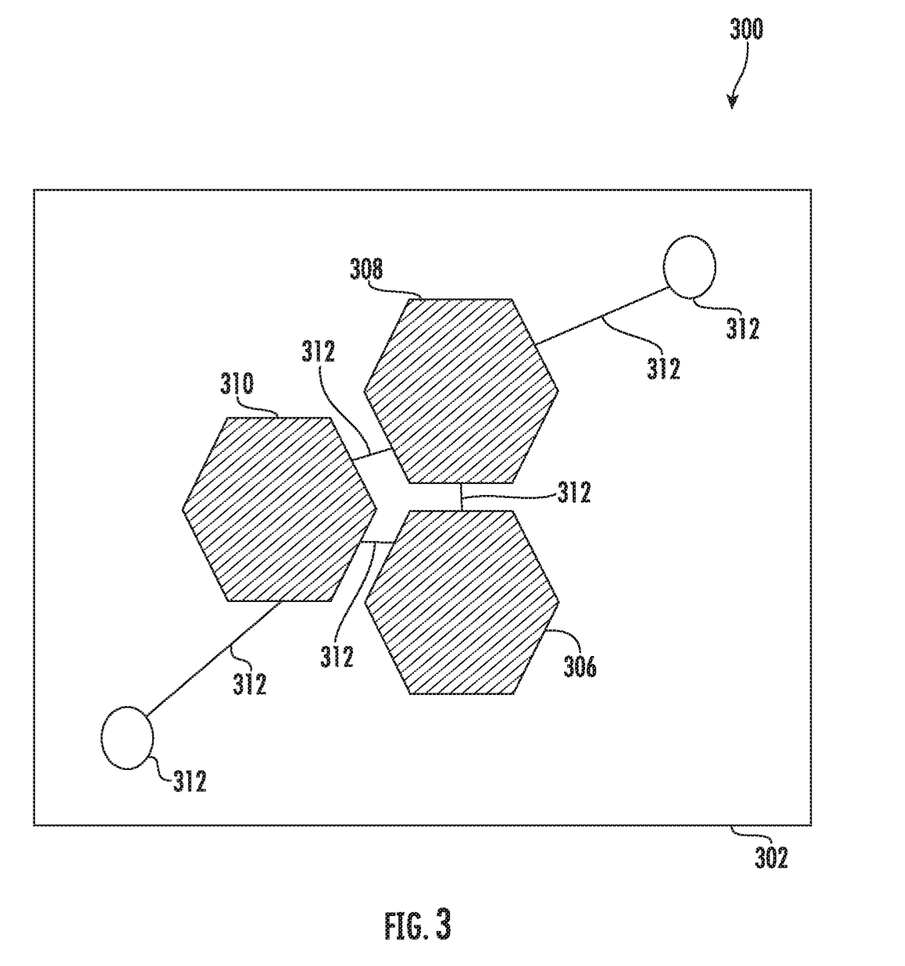
FIG. 3 illustrates a top view of an example solderless integrated circuit device on a flexible substrate with non-rectangular dies for bendable applications, according to the disclosure herein.

Referring next to FIG. 3, which illustrates a top view of integrated circuit device 300 and flexible substrate 302, the flexible substrate 302 comprising, in some embodiments, plasma-diced non-rectangular dies 306, 308, and 310 arranged in close proximity for bendable applications. In some embodiments, the plasma-diced non-rectangular dies 306, 308, and 310 can be placed or arranged as close to each other as the placement equipment allows. However, in some embodiments, the plasma-diced non-rectangular dies 306, 308, and 310 can be placed advantageously a certain distance apart such that they do not contact each other during flexion of the interconnect. Traditional methods of wafer-level fan-out require that the dies be spaced apart at least 100 µm to account for the filler particles of the over-molding. However, in some embodiments of the present disclosure, the method of heterogeneous integration does not have over-molding to account for, nor does it necessarily need to use a sacrificial layer (not shown here) that comprises filler particles. In some embodiments, the minimum spacing between the plasma-diced non-rectangular dies 306, 308, 310 can be determined by the shrinkage or expansion of the sacrificial material upon curing and the resulting impact of this on the drift of the plasma-diced non-rectangular dies 306, 308, 310 that are placed on, or adhered to, the carrier. More specifically, in some embodiments of the present disclosure, the plasma-diced non-rectangular dies 306, 308, 310 can be spaced apart with respect to one another by between about 50 µm and 100 µm. In some embodiments, the plasma-diced non-rectangular dies 306, 308, 310 can be spaced apart with respect to one another by about 5 µm. These plasma-diced non-rectangular dies 306, 308, 310 can have a structure substantially similar to the semiconductor dies 102 in the previous embodiments described above, but they are non-rectangular in shape, here. Similarly, the flexible substrate 302 can, in some embodiments, be comprised of a structure that is substantially similar to the wafer-level RDL 110 described above. This arrangement can be manufactured using the process described in FIGS. 1A-1H and FIG. 2. As described above, the flexible substrate 302 can be comprised of polyimide flex material or other substrate with suitable CTE characteristics. Additionally the contacts 312 connecting the various components and disposed within the flexible substrate 302 can be comprised of any of the metals disclosed for the contacts 112 in FIGS. 1A-1H.

However, those of ordinary skill in the art will appreciate that, in some embodiments, the plasma-diced non-rectangular dies 306, 308, and 310 are not limited to non-rectangular shape. Those of ordinary skill in the art will appreciate that they may be square or rectangular or plasma-diced into more complex shapes. The non-rectangular shape given to the dies 306, 308, and 310 in FIG. 3, though, would enable low-stress bending or flexing in three axes.

Figure 4:
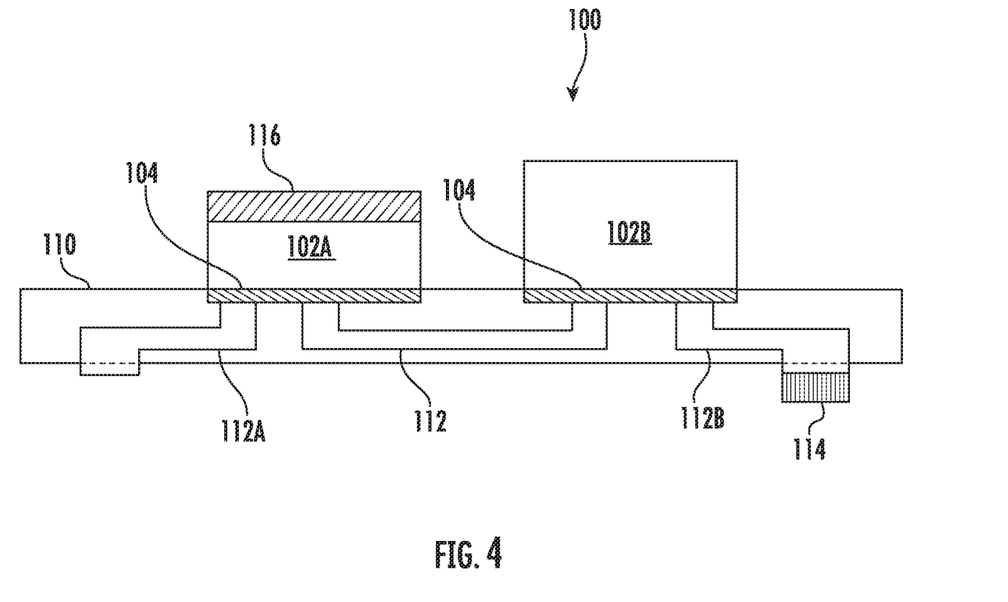
FIG. 4 illustrates a side view of the integrated circuit device with additional backside coatings, metallization, and/or passive components attached, according to the disclosure herein.

Referring next to FIG. 4, which illustrates a side view of an integrated circuit device 100 with many of the same features as the integrated circuit 100 in FIGS. 1A-1H. In FIG. 4, wafer-level RDL 110 comprises a plurality of semiconductor dies 102A and 102B arranged on it. The semiconductor dies 102A and 102B are arranged with their active sides 104 facing the wafer-level RDL 110. Furthermore, contacts 112 are disposed within the wafer-level RDL 110 and are in communication with the semiconductor dies 102A and 102B. To exhibit further variations of the integrated circuit device 100, integrated circuit device 100 comprises a few extra features, namely backside coating 116 integrated on semiconductor dies 102A, and passive component 114 mounted on contact 112B connected to semiconductor dies 102B. Those of ordinary skill in the art will appreciate that various backside coatings 116 or metallization could be integrated together on the integrated circuit device 100. Furthermore, those of ordinary skill in the art will appreciate that various passive components 114 could be solder mounted to either side of the integrated circuit device 100. Those of ordinary skill in the art will also appreciate that in some embodiments, it might be possible to assemble other components onto the flexible substrate/structure before final mounting (i.e., some of the attachment points could have components soldered to them and others could be mounted to a PCB by solder or physical attachment such as a screw).

Finally, those of ordinary skill in the art will appreciate that various embodiments of the present disclosure, depending on thermal requirements of the integrated circuit device, entire sub-assemblies could be co-designed with complementary metal-oxide-semiconductors (CMOS)/microelectromechanical systems (MEMS) to form very compact modules. Furthermore, embodiments of the present disclosure could accommodate various die thicknesses and form factors.

While the subject matter has been described herein with reference to specific aspects, features, and illustrative embodiments, it will be appreciated that the utility of the subject matter is not thus limited, but rather extends to and encompasses numerous other variations, modifications, and alternative embodiments, as will suggest themselves to those of ordinary skill in the field of the present subject matter, based on the disclosure herein.

Various combinations and sub-combinations of the structures and methods described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications, and alternative embodiments, within its scope and including equivalents of the claimed features.

What is claimed is:

1. A method for packaging one or more semiconductor dies for use in flexible electronics, the method comprising:
    arranging one or more semiconductor dies, each comprising at least an active side, in a desired arrangement within a sacrificial material layer;
    building a wafer-level redistribution layer (RDL) over the active side of each of the one or more semiconductor dies and the sacrificial material layer, wherein the wafer-level RDL forms a directly metallized connection with the active side of each of the one or more semiconductor dies;
    patterning a portion of the wafer-level RDL to form an outline of a final module footprint;
    affixing a first carrier to the wafer-level RDL built over the active side of the one or more semiconductor dies and the sacrificial material layer;
    removing at least a portion of the sacrificial material layer from the one or more semiconductor dies and the wafer-level RDL to achieve an integration of the one or more semiconductor dies; and
    removing the first carrier from the active side of the one or more semiconductor dies or individually removing integrated semiconductor dies, along with their respective wafer-level RDLs, from the first carrier;
    wherein the wafer-level RDL comprises a flexible substrate material and serves as a flexible supporting substrate of the one or more semiconductor dies.

2. The method of claim 1, wherein the one or more semiconductor dies comprises a plurality of semiconductor dies.

3. The method of claim 2, wherein the flexible substrate material comprises die-to-die interconnects with material properties that reduce stress caused by cyclic thermal expansion and contraction.

4. The method of claim 1, wherein the wafer-level RDL comprises one or more contacts; and wherein each of the one or more contacts is in electronic communication with at least one semiconductor die of the one or more semiconductor dies.

5. The method of claim 4, wherein the one or more contacts comprise a metal selected from the group consisting of copper, aluminum, nickel, gold, titanium, vanadium, silver, and chromium.

6. The method of claim 4, further comprising exposing the one or more contacts on an opposite side of the wafer-level RDL as the one or more semiconductor dies.

7. The method of claim 4, further comprising providing redistribution metals or dielectrics, or redistribution metals and dielectrics, without solder, as a structural and electrical connection between the one or more semiconductor dies and the one or more contacts.

8. The method of claim 1, wherein the one or more semiconductor dies are plasma-diced or non-rectangular in shape.

9. The method of claim 8, wherein the one or more semiconductor dies are arranged in close proximity to one another for bendable applications.

10. The method of claim 1, wherein arranging the one or more semiconductor dies in the desired arrangement comprises arranging the one or more semiconductor dies on a second carrier, wherein the active side of each of the one or more semiconductor dies is placed on the first carrier.

11. The method of claim 10, wherein the sacrificial material layer is deposited over the one or more semiconductor dies and the second carrier.

12. The method of claim 11 further comprising removing the second carrier from the sacrificial material layer and the one or more semiconductor dies.

* * * * *